United States Patent [19]

Baschiera et al.

[11] Patent Number: 4,789,821
[45] Date of Patent: Dec. 6, 1988

[54] TEST DEVICE FOR A COMBINATORIAL LOGIC CIRCUIT AND INTEGRATED CIRCUIT INCLUDING SUCH A DEVICE

[75] Inventors: Daniel Baschiera, Grenoble; Bernard Courtois, Voreppe, both of France

[73] Assignee: U.S. Philips Corporation, New York, N.Y.

[21] Appl. No.: 1,306

[22] Filed: Jan. 8, 1987

[30] Foreign Application Priority Data

Jan. 10, 1986 [FR] France ................. 86 00275

[51] Int. Cl.$^4$ .................................. G01R 31/28
[52] U.S. Cl. ...................... 324/73 R; 324/158 R; 371/15; 371/16
[58] Field of Search .......... 324/73 R, 158 R; 371/20, 27; 364/717; 321/25, 16, 15

[56] References Cited

U.S. PATENT DOCUMENTS

T930,005  1/1975  Chia et al. ............. 371/27 X
3,924,181  12/1978  Alderson ............... 324/73
4,584,683  4/1986  Shimizu ................ 371/27 X

FOREIGN PATENT DOCUMENTS 1174931  8/1985  U.S.S.R. ................ 371/27

OTHER PUBLICATIONS

Frohwerk; "Signature Analysis: A New Digital Field Service Method"; Hewlett Packard Journal; May 1977; vol. 28, No. 9 pp. 1–8.
Fasang; "Circuit Module Implements Practical Self Testing"; Electronics; May 19, 1982; pp. 164–165.
Könemann et al.; "Built In Test For Complex Digital Integrated Circuits"; 1980 IEEE Journal of Solid State Circuits, vol. 15, No. 3; Jun. 1980; pp. 315–319.
Baschiera et al.; "Test Generation For Cmos S-Open and S-On Faults"; Rapport De Reserche N.533; May 1985; pp. 1–49.

Primary Examiner—Reinhard J. Eisenzopf
Assistant Examiner—Vinh P. Nguyen
Attorney, Agent, or Firm—Thomas A. Briody; Jack E. Haken; Anne E. Barschall

[57] ABSTRACT

This device and method for testing a combinative logic circuit (4), includes on the one hand a circuit generating test sequences (30) for applying test logic signals to N inputs of the combinative logic circuit and, on the other hand, an output circuit (5) to analyze the output signals of the combinative logic circuit. These test sequences are successively applied to each of the N inputs (E1, E2, E3 and E4) so that an alternating series, at least twice, of logic "1"'s and of logic "0"'s while a word of N−1 bits is applied to the other inputs to ensure the transmission of the said alternating series to the output of the combinative logic circuit.

11 Claims, 9 Drawing Sheets

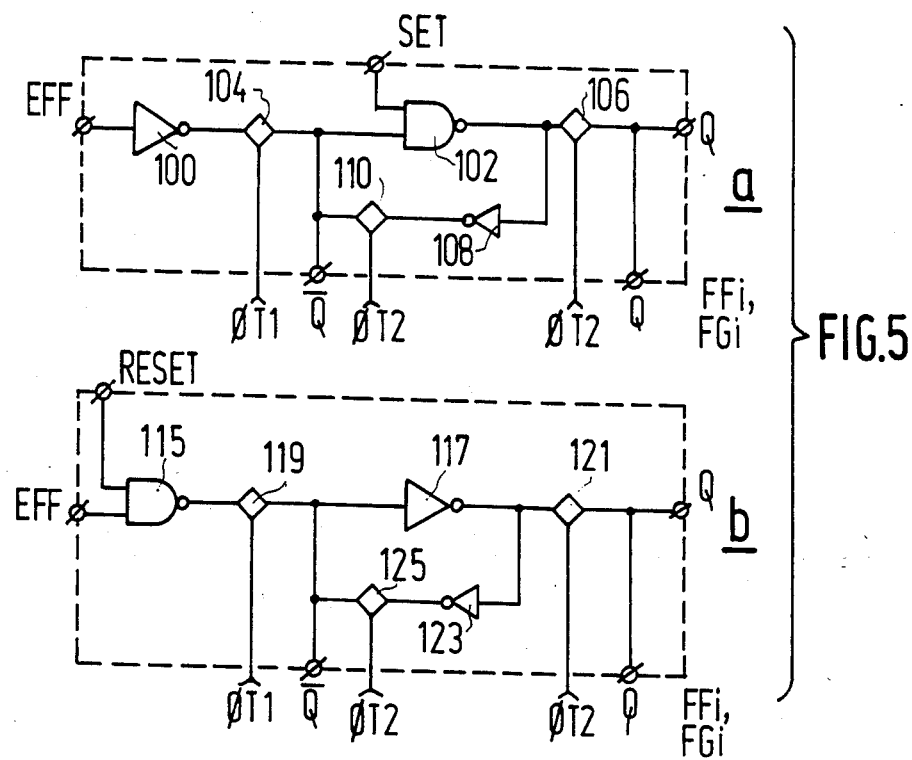
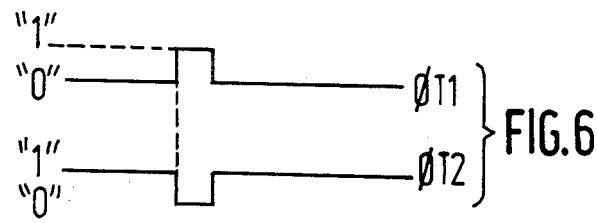
FIG.5
FIG.6

| EA | EB | NS |
|----|----|----|
| B  | B  | H  |
| B  | H  | H  |
| H  | B  | H  |
| H  | H  | B  |

TAB. I
FIG. 12a

| EA | EB | NS |
|----|----|----|
| H  | H  | B  |
| H  | B  | H  |
| B  | H  | H  |
| H  | H  | B  |

TAB. II
FIG. 12b

| EA | EB | NS |
|----|----|----|
| H  | H  | B  |
| H  | B  | B  |
| H  | H  | B  |

TAB. III
FIG. 12c

| Vect No | Inp. FF1: SFF4 ⊕ INR | Outp. SFF1 | Inp. FF2: SFF1 ⊕ SFF4 | SFF2 | SFF3 | SFF4 | Vect. suppl |
|---------|----------------------|------------|------------------------|------|------|------|-------------|
| 0       | 0 →1                 | 0          | 0                      | 0    | 0    | 0    | 0000        |
| 1       | 0                    | 1          | 1                      | 0    | 0    | 0    | 1000        |
| 2       | 0                    | 0          | 0                      | 1    | 0    | 0    | 0100        |
| 3       | 0                    | 0          | 0                      | 0    | 1    | 0    | 0010        |
| 4       | 1                    | 0          | 1                      | 1    | 0    | 1    | 0001        |
| 5       | 0                    | 1          | 1                      | 1    | 1    | 0    | 1100        |
| 6       | 0                    | 0          | 0                      | 1    | 1    | 0    | 0110        |
| 7       | 1                    | 0          | 1                      | 1    | 1    | 1    | 0011        |
| 8       | 1                    | 1          | 0                      | 1    | 1    | 1    | 1101        |
| 9       | 0                    | 1          | 1                      | 0    | 1    | 0    | 1010        |
| 10      | 1                    | 0          | 1                      | 1    | 0    | 1    | 0101        |
| 11      | 0                    | 1          | 1                      | 1    | 0    | 0    | 1110        |
| 12      | 1                    | 0          | 1                      | 1    | 1    | 1    | 0111        |
| 13      | 1                    | 1          | 0                      | 1    | 0    | 1    | 1111        |
| 14      | 1                    | 1          | 0                      | 0    | 1    | 1    | 1011        |
| 15      | 1                    | 1          | 0                      | 0    | 0    | 1    | 1001        |
| 16      | 0                    | 1          | 1                      | 0    | 0    | 0    | 1000        |

TAB. IV
FIG. 12d

TEST DEVICE FOR A COMBINATORIAL LOGIC CIRCUIT AND INTEGRATED CIRCUIT INCLUDING SUCH A DEVICE

BACKGROUND OF THE INVENTION

1. Field of the Invention

The present invention relates to a test device for testing a combinatorial logic circuit, comprising a generator circuit for generating test bit sequences to N inputs of the combinatorial circuit in parallel, these test bit sequences comprising applying to each particular one of the N inputs at least two mutually opposed signal inversions between zero and one, each inversion being combined with an (N−1) bit word to the other inputs for ensuring transmission of the inversion to an output of the logic circuit, said test device furthermore comprising an output circuit for analyzing an output signal of the combinatorial circuit.

2. Prior Art

Such a device has important applications, principally in the testing of integrated logic circuits in CMOS technology. This technology allows a high degree of integration, and this requires tests on the correct functioning of the circuit not only at the end of manufacture but also when the device is mounted on an assembly such as a printed circuit board. For such an assembly, testing intervals are provided to alternate with the normal functioning.

A method as set forth in the Field of the Invention has been described in the research report RR533 issued in May 1985 and published by IMAG, 46 Avenue Felix Viallet 38031 Grenoble CEDEX FRANCE. This method avoids such faulty responses of the logic circuit in that certain malfunctions could make it behave like a sequential circuit as opposed to a combinatorial one.

SUMMARY OF THE INVENTION

The present invention provides a simple test device meeting the requirements formulated in the above-mentioned research report. For this purpose, in a test device according to the invention the generator circuit comprises a feedback shift register as a pseudo-random sequence generator, a bit selection circuit having a capacity of N-bits wide for selectively generating one selection signal and N−1 non-selection signals, an inversion control circuit fed by said feedback shift register for therefrom receiving an N-bit vector in parallel and cooperating with said bit selection circuit for inverting a selected bit at least twice in succession, and interconnection means for feeding said selected bit and N−1 non-selected bits to associated inputs of said combinatorial circuit.

Such a test device, produced in the same CMOS technology as the combinatorial logic circuit to be tested, may occupy only a small space on the silicon chip. The invention also relates to an integrated circuit including such a device. In this case the test device should only have a complexity that is considerably less than that of the combinatorial logic circuit to be tested since the number of faults occurring directly depends on the combined complexity of the test circuit and of the circuit to be tested. Various advantageous aspects of the invention are recited in the dependent claims.

BRIEF DESCRIPTION OF THE FIGURES

The following description given with reference to the appended drawings, all given by way of non-limiting example, will give a good understanding of how the invention can be embodied.

FIGS. 5a and 5b show transfer flip-flops with resetting to "0" and "1" respectively.

FIG. 6 shows suitable waveforms for the flip-flops in FIGS. 5a and 5b.

FIG. 12a, Table I, is a truth table corresponding to FIG. 2.

FIG. 12b, Table II, shows results of a series of test inputs to FIG. 2, when FIG. 2 is functioning correctly.

FIG. 12c, Table III, shows results of a series of test inputs to FIG. 2, when FIG. 2 is not functioning correctly.

FIG. 12d, Table IV, shows the behavior of a generator of pseudo-random sequences.

DESCRIPTION OF THE TEST STRATEGY

Figure 1:
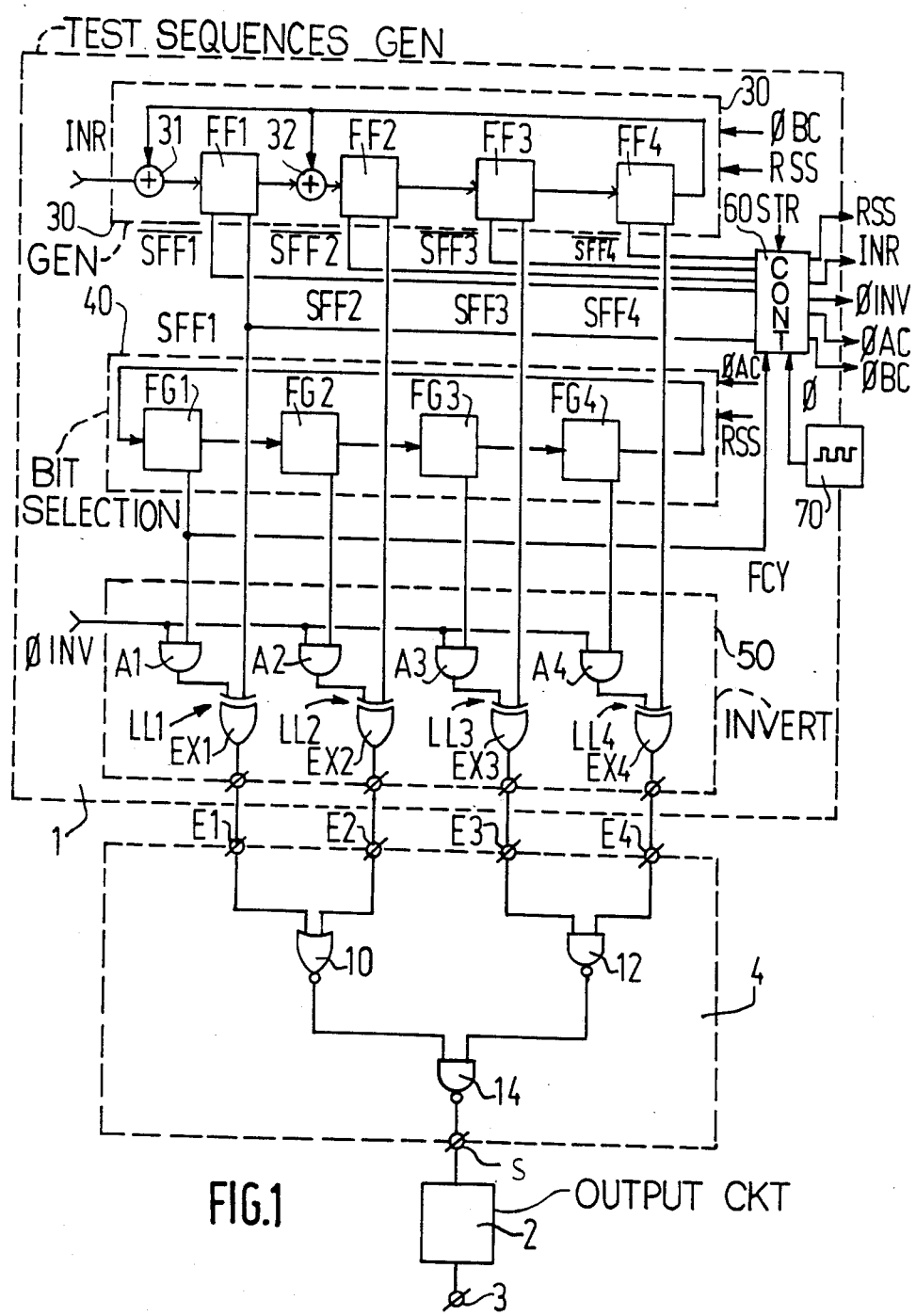
FIG. 1 shows a test device according to the invention.

FIG. 1 shows a test device according to the invention. This comprises two sections: the first section is formed by a test sequences generator 1 and the second section is formed by an output circuit 2 supplying, on an output terminal 3, a signal indicating if a combinatorial logic circuit 4 to be tested is functioning satisfactorily according to signature analysis. Signature analysis is described in the article "Signature Analysis: A new Digital Field Service Method" by Robert A. Frohwerk which appears in the "HEWLETT PACKARD JOURNAL", May 1977, Vol. 28, No. 9 pages 1 to 8, and will be discussed no further.

In order to facilitate the description of the present invention, the logic circuit to be tested 4 has a simple structure; in practice, the device of the invention is particularly helpful even when the circuit 4 is of complex structure.

This combinatorial logic circuit is provided with four inputs E1, E2, E3 and E4 and one output S; it includes a NOR gate 10 whose two inputs are connected to the terminals E1 and E2, a first NAND gate 12 whose to inputs are connected to the terminals E3 and E4 and a second NAND gate 14 whose two inputs are connected to the two outputs of gates 10 and 12 respectively and whose output forms the output S of the circuit 4.

According to the test method recommended in the abovementioned research report, there is tested the transmission of an alternating series of logic signals 1, 0, 1 or 0, 1, 0 applied to one of the inputs E1, E2, E3 and E4 while the signals at the other inputs must allow the transmission of this sequence. For example, if it is required to test the transmission of the alternating series applied to input E1, it is necessary that gate 10 is in the passing state, i.e. there must be a logic "0" signal at E2, and gate 14 must also be in this state, i.e. the signal at the output of gate 12 must have the value "1". In order to have this signal of value "1" at the output of gate 12, it is necessary that at least one of the signals applied to the inputs E3 and E4 has the value "0". In order to test the transmission of the alternating series applied to input E2, it is necessary to have a "0" signal at input E1 and at least one "0" signal at inputs E3 and E4. For input E3, it is necessary that a "1" signal is applied to input E4 and that signals of logic "0" value are applied to inputs E1 and E2. For input E4, it is necessary that a "1" signal is applied to input E3 and that "0" signals are applied to inputs E1 and E2. In practice, the combinatorial circuit 4 can have a larger width, such as 16 or 32 bits, and also the logic depth may be larger. The output of the combinatorial circuit may have a greater bit width, each separate bit then requiring an associated evaluation. The combinatorial circuit may be designated either to fulfill a stand-alone function, or be part of a large circuit. The test circuit 1, 4 may be integrated within the same integrated circuit chip as the combinatorial circuit 4 or represent a separate circuit. Especially in the former case the connection between the test sequences generator 1 and the output circuit 2 with the circuit 4 may be selectively activatable by gating means not shown for brevity. If the connection is not effective, the input of circuit 4 would be able to receive user signals from sources not shown. Similar considerations apply to the connection between circuit 4 and output circuit 2. Also here, in a non-test situation a user device may be connected to receive various user signals.

EXAMPLES OF CIRCUITS IN CMOS TECHNOLOGY

Figure 2:
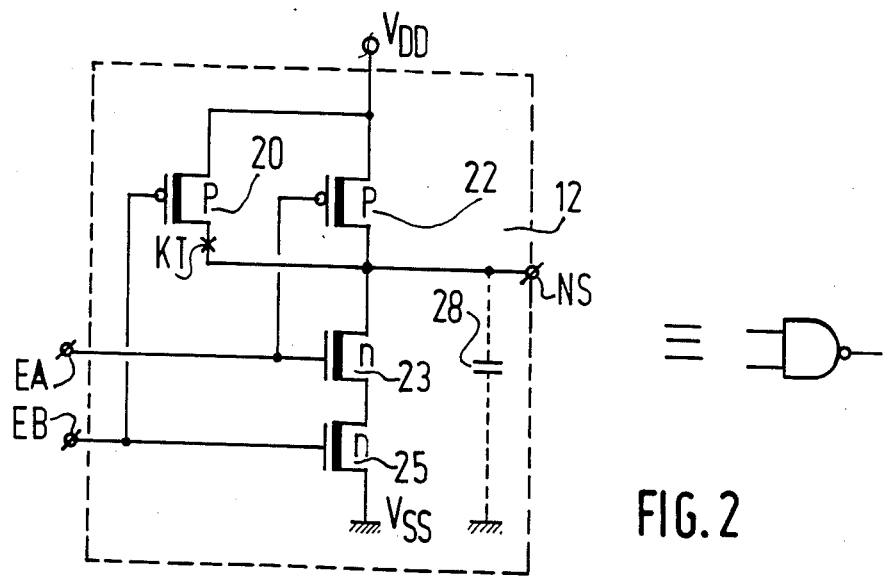
FIG. 2 shows the structure of a NAND gate produced in CMOS technology.

In FIG. 2 the NAND gate 12 or 14 is shown in detail in CMOS technology.

The gate is formed from two MOS "p" channel transistors 20 and 22 connected in parallel i.e. with their sources and drains interconnected, and from two MOS "n" channel transistors 23 and 25 connected in series. The source of transistor 25 is at the common potential VSS and the sources of transistors 20 and 22 are at the supply potential VDD. The drains of transistors 20 and 22 are connected to the drain of transistor 23. The input signals of this gate are applied to inputs EA and EB. Input EA is formed by the gate electrodes of transistors 22 and 23 and input EB is formed by the gate electrodes of transistors 20 and 25. The output NS is taken from the drain of transistor 23. At the right hand side a symbolic representation of this NAND gate is given.

When this gate functions correctly, in order to have a low value signal (VSS) at the output NS, it is necessary that transistors 23 and 25 are conducting and that transistors 20 and 22 are cut off. This implies that the signals at EA and EB are both at the high value (VDD). If one or both of the input signals have a low value, one or both of the transistors 20 and 22 conduct while one or both of the transistors 23 and 25 are cut off. The value of the signal at the output NS is therefore high.

The truth table is given in Table I where B and H represent the low and high values of the signals respectively, i.e. the logic "0"'s and "1"'s.

In FIG. 2, a capacitor 28 representing the capacity contributed by the following stage (e.g. gate 14) has been represented in dotted lines.

The reference KT represents a possible break at the drain of transistor 20. The test is therefore carried out by successively applying the signals of value H and B to the inputs EA and EB in the order shown in Table I, the capacitor 28 charged to the state where EA=B and EB=B will remain so for the other states where EA=B, EB=H and EA=H and EB=B; the signal at the output NS will take the value B when EA=H and EB=H.

Now, in order to detect the break KT, it is necessary to apply a "1" or H value to input EA and an alternating series, for example, H, B, H to the input EB. In this way also the possibility of a break of the transistor 25 is tested. Table II gives the value NS for the case in which the gate is functioning correctly. In this case, the alternating series is transmitted as a complement.

Table III shows that this sequence is not transmitted with the break KT present. The latter prevents capacitor 28 from charging to the state where EA=H and EB=B.

The previous mentioned report, gives other examples to indicate the effectiveness of the method.

DESCRIPTION OF THE TEST SEQUENCE GENERATOR

According to the invention, in order to test the combinatorial logic circuit 4, the test sequences generator 1 comprises a generator 30 for pseudo-random four-bit sequences formed by a shift register. This includes four flip-flops FF1, FF2, FF3 and FF4 supplying the signals SFF1 and $\overline{SFF1}$ for the first, SFF2 and $\overline{SSF2}$ for the second, SFF3 and $\overline{SSF3}$ for the third and finally SFF4 and $\overline{SSF4}$ for the fourth respectively. With these flip-flops there is associated a feedback network including two EXCLUSIVE-OR gates referenced 31 and 32. Gate 31 is inserted between flip-flops FF4 and FF1 and gate 32 between flip-flops FF1 and FF2. An input signal INR is fed to gate 31 and the output signal of flip-flop FF4 is fed to gate 32. Such a generator of pseudo-random sequences supplies binary words or vectors occurring successively as shown in Table IV. To proceed from vector No. 0 to vector No. 1 a signal INB of value "1" must be applied to the input of flip-flop FF1 and then, after this injection, the signal INR is kept at the value "0". The test generator 1 also comprises a bit selection circuit 40 including four flip-flops FG1, FG2, FG3 and FG4 connected as a shift register such that an active signal at the output of flip-flop FG1 can select the signal SFF1, that an active signal at the output of flip-flop FG2 can select the signal SFF2, that an active signal at the output of flip-flop FG3 can select the signal SFF3 and, finally, that an active signal at the output of flip-flop FG4 can select the signal SFF4. The bit selection circuit operates in the way of a ring counter.

The generator 1 is also provided with an inverting circuit 50 to invert the selected bit at least twice. This inverting circuit is formed from four elementary logic circuits LL1, LL2, LL3 and LL4. Each of these circuits includes an EXCLUSIVE-OR gate, EX1, EX2, EX3, and EX4 respectively whose outputs are connected to inputs E1, E2, E3 and E4 respectively of the combinatorial logic circuit 4 to be tested. The first inputs of these gates receive the signals SFF1, SFF2, SFF3 and SFF4 respectively and the second inputs are connected to the output of the two-input AND gates referenced by A1, A2, A3 and A4. One input of these gates A1, A2, A3 and A4 is connected to the output of a control circuit 60 of the test device in order to receive a signal φINV and the second inputs of these gates are connected to the outputs of flip-flops FG1, FG2, FG3 and FG4 respectively.

The entire generator 1 is controlled by a control circuit 60. This circuit 60 uses the signals φ of a clock 70 which can either be incorporated in the generator, or can be part of the circuit to be tested. The structure of control circuit 60 is independent of the number of inputs $E_i$ of the circuit to be tested.

Figure 3:
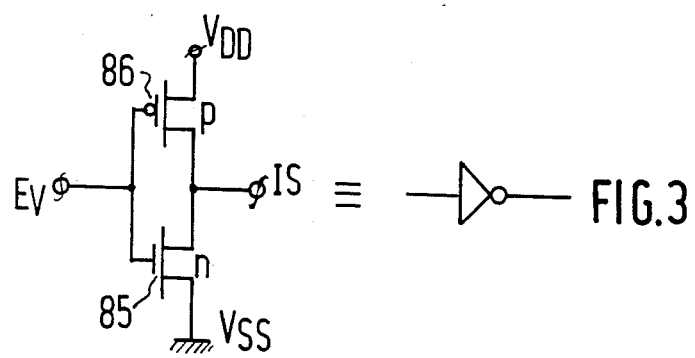
FIG. 3 shows the structure of a logic signal inverter produced in CMOS technology.

Before explaining the invention in greater detail, the structures of some elements constructed in CMOS logic which are to be included in the circuits of the invention will be reviewed. In FIG. 2 a NAND gate has already been shown; in FIG. 3 is represented an inverter circuit; the input EV of this inverter is connected to the gate electrodes of the "n" type and "p" type MOS transistors respectively references 85 and 86; the drain-source paths of these transistors connected in series are connected between the supply voltage VDD and ground VSS. The output IS is taken from the connection of the two drains of transistors 85 and 86. At the right hand side a symbolic representation of this inverter is given.

Figure 4:
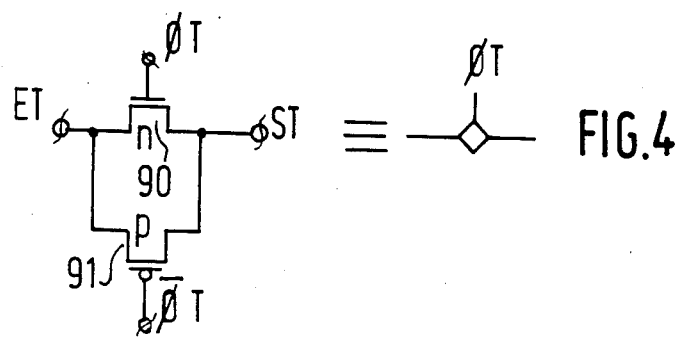
FIG. 4 shows the structure of a transfer unit suitable for production in CMOS technology.

FIG. 4 gives a transfer device in CMOS technology. Such transfer devices are often used between an AND input terminal and an output ST. Between these terminals there is interconnected the source-drain path of a MOSn transistor 90 and a MOSp transistor 91. This path can be made open or closed depending on the logic value φT or $\overline{\phi T}$ applied to the gate electrodes of transistors 90 and 91. Again, at the right hand side a symbolic representation of this transfer device is given.

FIGS. 5a and 5b represent structures of possible realizations for the flip-flops FF1 to FF4 and FG1 to FG4. FIG. 5a shows a structure with a SET input active on a logic "0" to set this flip-flop to "1" (the signal at the output Q takes the value "1"). The flip-flop in FIG. 5a is provided with an input EFF connected to the input of an inverter 100. The latter has an output connected to an input of a NAND gate 102 through a transfer device 104 controlled by a signal φT1. The SET input is connected to the remaining input of the NAND gate 102 whose output is connected to the output Q through a transfer device 106 controlled by a signal φT2. The output of gate 102 is also connected to the input of an inverter 108 whose output is connected to the output $\overline{Q}$ through a transfer device 110 controlled by φT2. The signals φT1 and φT2 are in practice complementary signals that do not overlap as required by the functioning of active circuits in CMOS technology. The exact requirements depend on the operating speed.

FIG. 5b shows a cell with a RESET input active on a logic "0" in order to set this flip-flop to "0" (the signal at its Q output takes the value "0"). The flip-flop of FIG. 5b is provided with an input EFF connected to one of the two inputs of a NAND gate 115; the second input is connected to the RESET input. The output of this NAND gate 115 is connected to the input of an inverter 117 through a transfer device 119 activated by the signals φT1. The output of this device 119 forms the output $\overline{Q}$ of the flip-flop. A transfer device 121 activated by the signals φT2 is inserted between the output of inverter 117 and the output Q of the flip-flop. A further inverter 123 is fed by inverter 117 while its output is connected to the output $\overline{Q}$ through a transfer device 125 activated by the signals φT2.

FIG. 6 shows the waveforms of the signal φT1 and φT2 which are never active (logic "1" value) at the same time.

In FIG. 1 the cells FF1, FF2, FF3, FF4, FG2, FG3 and FG4 are of the type shown in FIG. 5b, i.e. their RESET input receives a signal RSS, while cell FG1 is of the type shown in FIG. 5a, i.e. its SET input receives the signal RSS. The generator 30 functions at the rate of the signals φBC and circuit 40 functions at the rate of the signals φAC.

Figure 7:
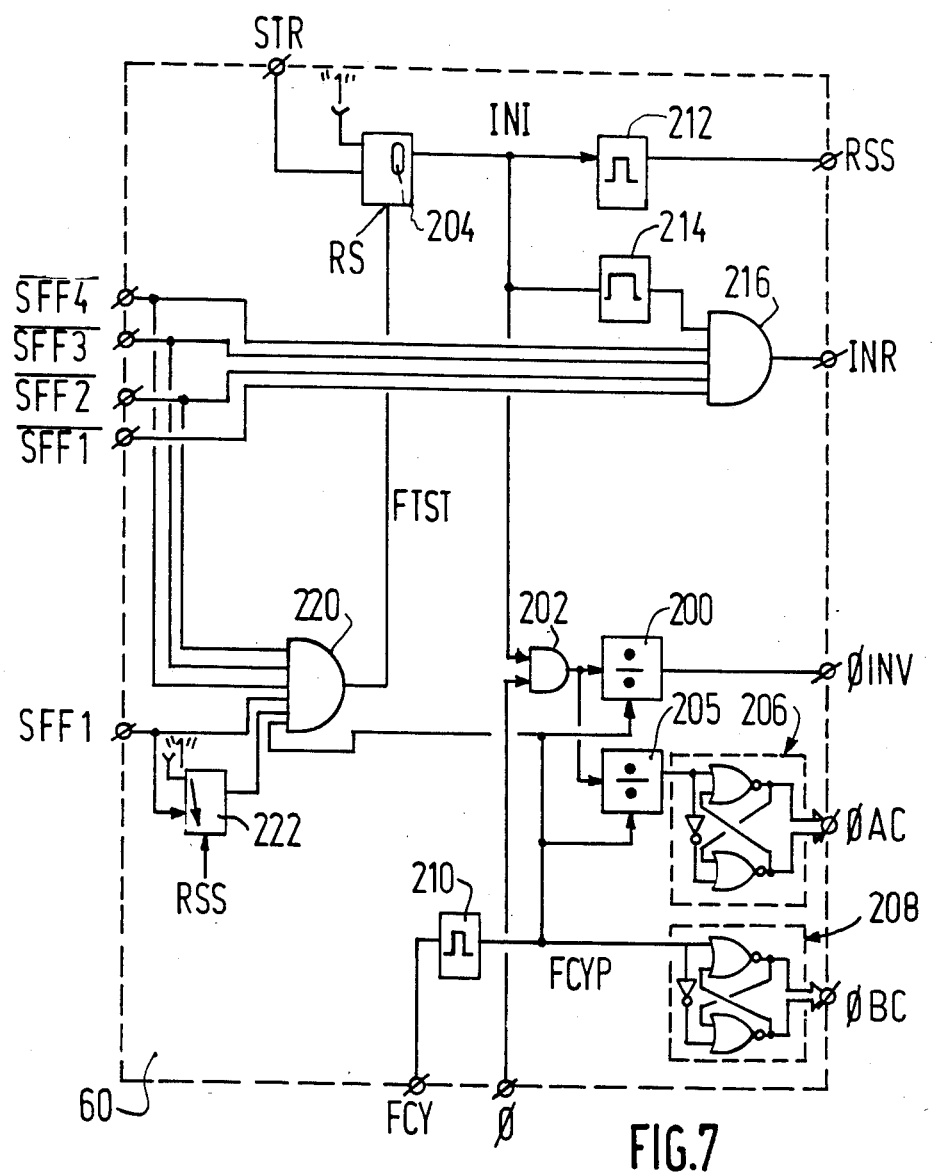
FIG. 7 shows an examplary control circuit that is part of the device of FIG. 1.

FIG. 7 shows the control circuit in detail. The clock signal φ is applied to a first frequency divider 200 through an AND gate 202 which can be made conducting or cut-off under the influence of a signal INI provided at the output Q of a flip-flop 204. The output signal of the divider 200 is the signal φINV. A second frequency divider 205 supplies the signals φAC through a flip-flop 206 which forms a non-overlapping set of mutually inverse signals for controlling the bit selection circuit 40. The waveform of these signals is to be made according to that of the signals φT1 and φT2 of FIG. 6. Similarly, a flip-flop 208 produces from output signals FCYP of a monostable circuit 210 of a set of mutually inverse signals φBC for activating the progression of the sequence generator 30. The input of this monostable circuit 210 receives the signal FCY. The data flip-flop 204 goes to the "1" state as soon as a test start signal STR becomes active, triggered by the user when he wishes to make a test. The signal INI at the output of this flip-flop 204 therefore remains at "1" as long as the test process is running.

The changing of the signal INI to "1" produces, by means of a monostable circuit 212, a short initialization pulse RSS for the various circuits and also provides a long pulse of duration longer than the period of the signal φBC by means of monostable circuit 214; it is from this long pulse that the signal INR is formed. This signals appears at the output of a decoder 216 providing a "1" signal if the signals $\overline{SFF1}$, $\overline{SFF2}$, $\overline{SFF3}$, $\overline{SFF4}$ and the output signal of the monostable circuit 214 are equal to "1".

To stop the test process the second appearance of the word "1000" is detected, i.e. vector No 16 of Table IV. In order to do this, a decoder 220 has been provided which supplies a reset to zero signal for the flip-flop 204 only if the signals $\overline{SFF2}$, $\overline{SFF3}$, $\overline{SFF4}$, SFF1, FCYP and the output signal of a flip-flop 222 are equal to "1". The edge-triggered flip-flop 222 goes to the "1" state when the signal SFF1 goes from "1" to "0".

Figure 8:
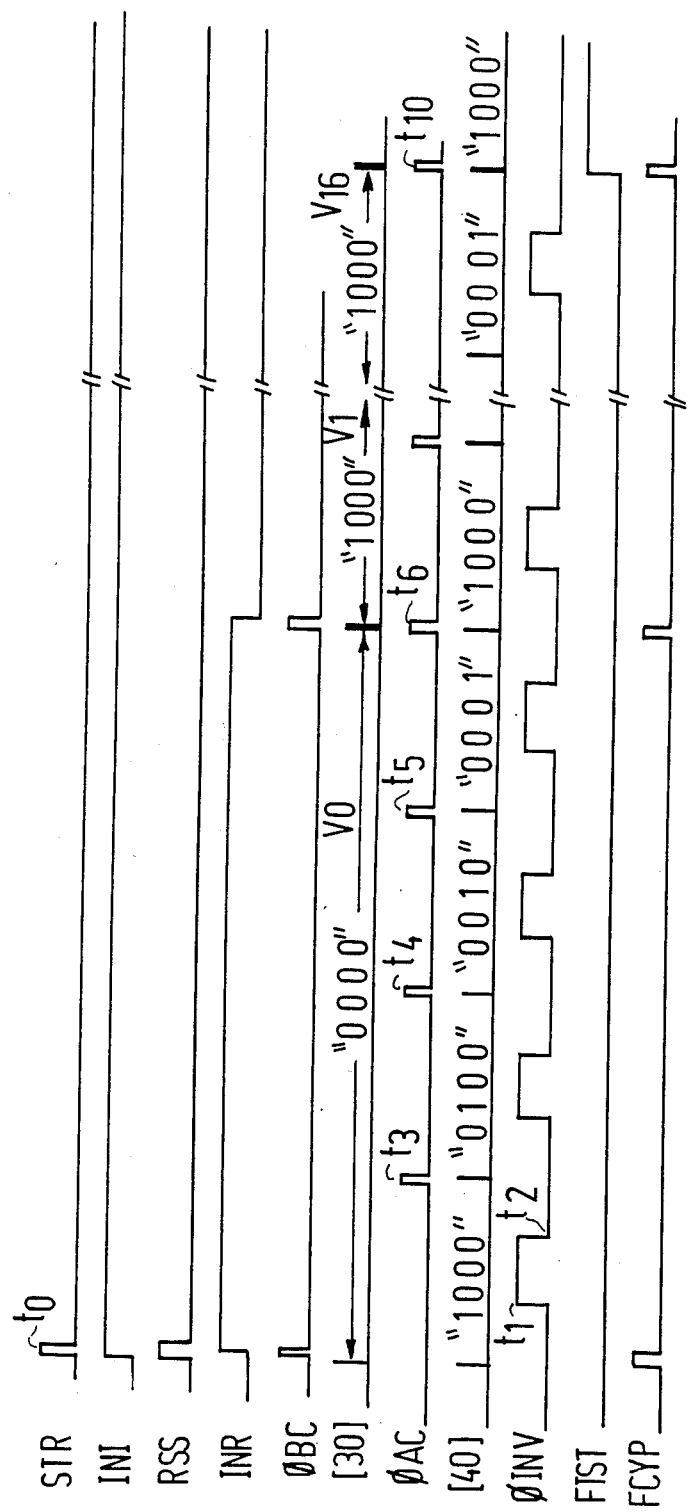
FIG. 8 is a timing diagram intended for the explanation of the functioning of the control circuit in FIG. 7.

The operation of circuit 60 in FIG. 1 is explained with reference to FIG. 8. Everything begins at time $t_0$ when a start pulse STR appears. The signal INI takes the value "1". The initialization pulse RSS is formed and this initializes on the one hand the generator 30 so that this generator supplies vector No. 0 "0000" and, on the other hand, the bit selection circuit such that it supplies the binary word "1000", which gives rise to the activation of the signal FCY. Pulse FCYP from circuit 210 resets the divider circuits 200 and 205 to zero. It should be noted that the signal φBC triggered by the signal FCYP has no effect on the generator 30 as the pulse RSS is sufficiently long to mask the signal φBC. Now, signal φINV has the value "0". As gate 202 is opened by the signal INI, the circuit 200 supplies a "1" signal at time $t_1$ and then a "0" signal at time $t_2$. At time $t_3$ it is the turn of the divider circuit 205 to provide an active signal (φAC) so that the content of the bit selection circuit 40 becomes "0100"; this content successively becomes "0010" and "0001" at times $t_4$ and $t_5$. At time $t_6$, the signal FCY becomes active again and activates the monostable circuit 210 so that a signal φBC appears for the sequence generator 30. As the signal INR has the value "1" at its input, the vector produced by this generator is therefore "1000", which makes the signal INR drop back to "0". The sequence generator will therefore be able to provide the various vectors of Table IV. The process subsequently runs for each vector in the way indicated above, until the time at which vector V16 is produced by the generator 30 and where the content of circuit 40 is "0001"; at time $t_{10}$, the signal $\phi$AC becomes active so that the content of the circuit becomes "1000"; the signal of the decoder then becomes active and the flip-flop 204 goes to the "0" state blocking the gate 202; the signals $\phi$INV and $\phi$AC do not change any more, with the result that the signal FCY will no longer be active. The control circuit is therefore stopped, the test process being completed.

Figure 9:
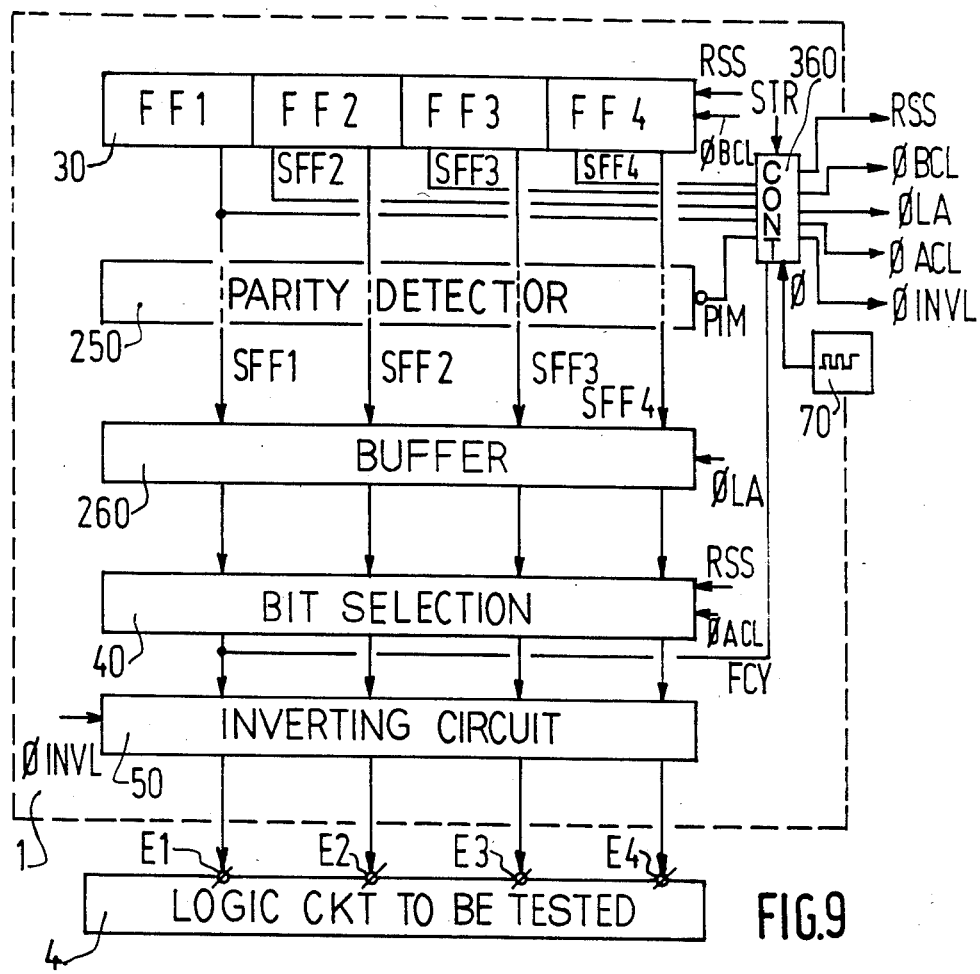
FIG. 9 shows a preferred embodiment of the test sequences generator.

FIG. 9 shows a further embodiment of a test sequences generator circuit. This generator has the advantage that of $2^N$ vectors that are generated in fact only $2^{N-1}$ are used, thereby shortening the test sequence length. The originally described pseudo-random sequences generator 30 now feeds a parity detector 250; this detector provides a signal PIM whose logic value indicates whether the vector produced by the generator 30 has an even or odd number of bits of value "1". According to the parity criterion chosen (for example only vectors having an odd number of bits of binary value "1" will be considered), the vector will or will not be recorded in a buffer memory 260. At the output of this buffer memory there has been placed the bit selection circuit 40 and the inverting circuit 50. The functioning of the generating circuit is controlled by the signals produced by the control circuit 360 which provide the initialization signals RSS practically unchanged with respect to those of circuit 60. On the other hand, the appearance of the progression signals of circuits 30 has been modified and these signals bear the reference $\phi$BCL. This control circuit also supplies the signals $\phi$LA to control the loading of the actually produced vector into buffer register 260 as governed by circuit 250. The control circuit also produces the signal $\phi$ACL for the progression of the bit selection circuit. The signals for circuit 50 are referenced $\phi$INVL. Instead of the odd/even parity selection, also a higher level of parity may be used, e.g. only bit sequences that have $(4k+1)$ "ones", wherein $k=0,1\ldots$.

Figure 10:
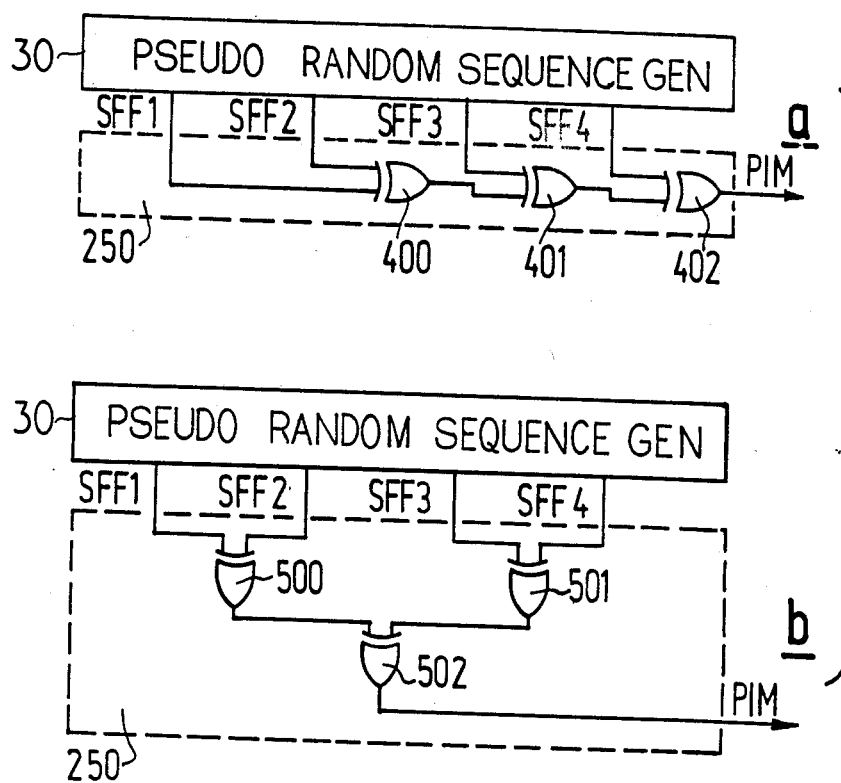
FIG. 10 shows a parity detector that is part of the generator of FIG. 9.

FIG. 10a shows a first embodiment of the parity detector 250; it is formed from three EXCLUSIVE OR gates 400, 401 and 402. The two inputs of gate 400 are connected to the outputs SFF1 and SFF2, the two inputs of gate 401 are connected to output SFF3 and the output of gate 400 respectively and the two inputs of gate 402 are connected to the output SFF4 and to the output of gate 401 respectively. The signal PIM appears at the output of gate 402. This structure has the advantage that it is modular, i.e. the pattern is repeated identically according to the number of stages in the pseudo-random sequences generator and it does not require a large integration area.

FIG. 10b shows a second example of embodiment of the parity detector 250; it is formed from three EXCLUSIVE OR gates 500, 501 and 502. The two inputs of gate 500 are connected to the outputs SFF1 and SFF2. The two inputs of gate 501 are connected to the outputs SFF3 and SFF4 and the two inputs of gate 502 are connected to the outputs of gates 500 and 501. The signal PIM appears at the output of gate 502. This circuit produces the signal PIM faster than the previous circuit.

Figure 11:
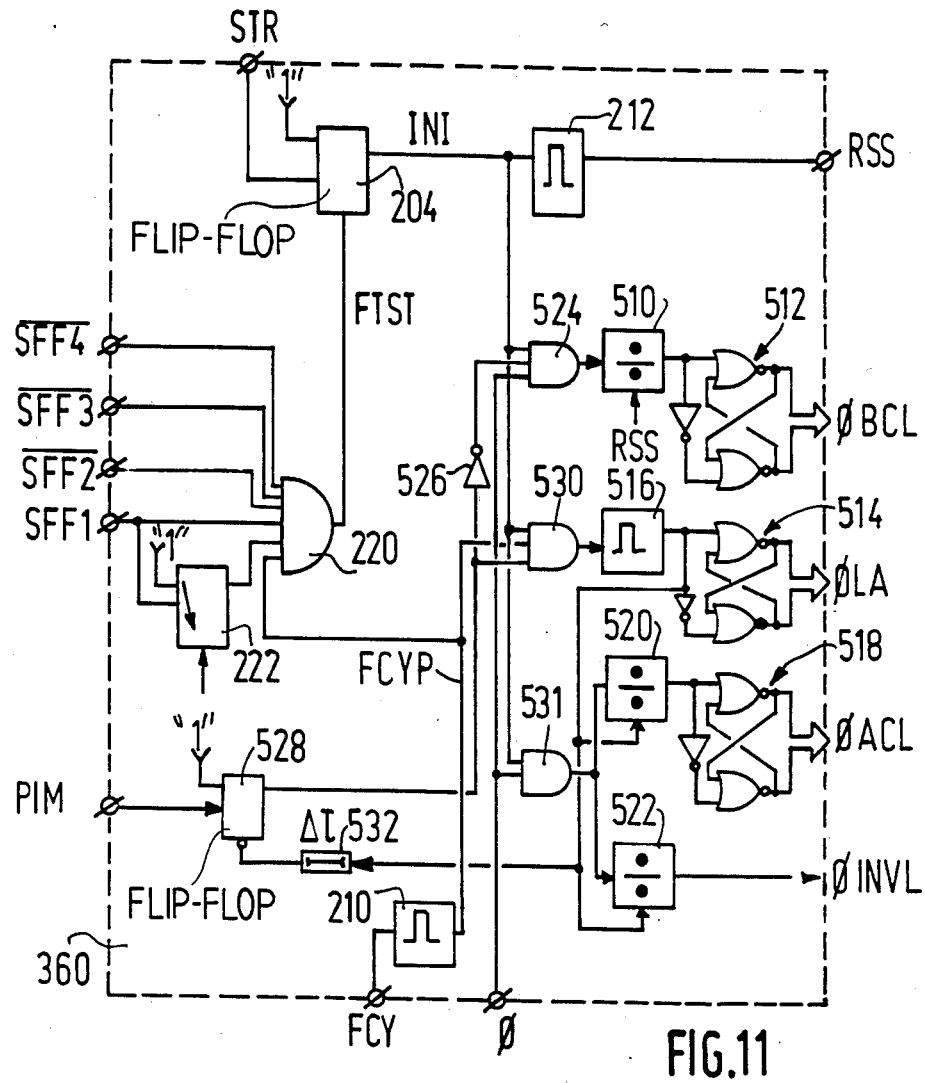
FIG. 11 shows the structure of the control circuit suitable for the generator of FIG. 9.

The control circuit 360 has a structure which is shown in detail in FIG. 11. In this circuit it is no longer necessary to provide the components to produce the signal INR because, on initialization, the vector "0000" is avoided. Initialization is carried out in this example by the vector "1000". On the other hand, a frequency divider 510 provides signals at a much higher frequency than the signals $\phi$BC produced by circuit 60. The signals of the divider 510 pass into a flip-flop 512; the signals $\phi$BCL that are necessary for the progression of the generator 30 are taken from the outputs of this flip-flop. The signals $\phi$LA for the loading of the buffer register 260 are produced by a flip-flop 514 from the output signals of a monostable circuit 516. The signals $\phi$ACL for the progression of the bit selection circuit are produced by a flip-flop 518 from the output signals of a frequency divider circuit 520. The $\phi$INVL signals come directly from the output of a frequency divider circuit 522. The signal applied to the input of the divider circuit 510 is the output signal of a three-input AND gate 524. One of these inputs receives the signal INI produced by the same component 204 as those of circuit 60. A second input is connected through an inverter 526 to the output Q of a flip-flop 528 and the third input receives the clock signals $\phi$. The signals applied to the inputs of the monostable circuit 516 come from a three-input AND gate 530. The first input receives the signal INI, the second receives the output signal of monostable circuit 210 of FIG. 7, and the third receives the output signal Q of the flip-flop 528. The signals applied to the inputs of the divider circuits 520 and 522 come from a two-input AND gate 531 of which one input receives the signals $\phi$ and the other receives the signal INI. The flip-flop 528 is put into the "1" state by the signal PIM indicating that an odd number of bits is provided by generator 30. This flip-flop is reset to the "0" state by the signal from a delay device 532 whose input is connected to the output of the monostable circuit 516; the delay $\Delta\tau$ produced by this device 532 corresponds with the time necessary to ensure loading of the vector by the generator 30 into the buffer register 260. The divider 510 is initialized by the signal RSS while the dividers 520 and 522 are initialized by the output signal of circuit 516. As soon as the output signal of flip-flop 528 is at "1", gate 524 is closed, which "freezes" the vector supplied by the generator 30. On initialization, signal FCY takes the value indicating an end of cycle, a pulse FCYP at the output of circuit 210 is transmitted to circuit 516 so that the signal $\phi$LA is activated and the divider circuits 520 and 522 are initialized. The signals $\phi$ACL and $\phi$INV will step the signals as has already been mentioned. Flip-flop 528 will then be reset to zero after the time lapse $\Delta$E. Gate 524 is open and, at a high frequency, generator 30 will progress until the produced vector has the required parity, gate 524 is closed and gate 530 is open so that at the next FCYP pulse the loading operation is again triggered. At the end of the test detected by the decoder 220, the signal INI takes the value "0" which blocks the gates 524 and 530. The test process is then completed. The signal FST takes the value "1" and it is then possible to trigger the reading of the output circuit 2.

It is noted that this embodiment reduces the number of vectors effectively applied to the terminals of the circuit to be tested by two while retaining the systematic aspect of the test.

In fact, considering the first example of embodiment, taking, for example, vector No. 3, 0010, after inversion for the first pin, the following sequence is obtained:

0010
1010
0010

It can be seen that this sequence has the same effect as the sequence obtained from vector 9 which gives the sequence:

1010
0010
1010

The sequences 101 and 010 applied to a certain pin gives identical test results.

The second example of embodiment therefore avoids this test redundancy.

What is claimed is:

1. A device for generating N-bit test sequences for testing a combinatorial logic circuit having N inputs, where N is an integer greater than one, the device comprising:
   a. a feedback shift register operating as a pseudo-random sequence generator, and having output means at which an N-bit vector is supplied;
   b. means for selectively generating a one bit selection signal and and an (N−1)-bit non-selection signal from the N-bit vector, so that inversions in the selection signal appear at an output of the combinatorial logic circuit;
   c. means for inverting the selection signal at least twice in succession; and
   d. means for feeding said selection signal and said non-selection signal in parallel to respective ones of said N inputs.

2. A test device as claimed in claim 1, wherein said inverting means comprises sequencing means for controlling a double inversion of each respective bit of a particular vector generated by said pseudo-random sequence generator.

3. The device of claim 1 or 2 further comprising:
   means for detecting a predetermined parity in said N-bit vector, said detecting means having an output at which a predetermined parity signal is supplied when the predetermined parity is detected; and
   a control circuit for gating said N-bit vector to said generating means under control of said predetermined parity signal, so that said N-bit vector is supplied to said generating means when said predetermined parity is detected and so that said N-bit vector is blocked from said generating means when said predetermined parity is not detected.

4. The device as claimed in claim 3, wherein said predetermined parity is an odd parity.

5. An integrated circuit comprising:
   a. a user device for performing user functions comprising combinatorial logic and having N inputs; and
   b. means for generating N-bit test sequences to the N inputs comprising:
      i. a feedback shift register operating as a pseudo-random sequence generator, and having output means at which an N-bit vector is supplied;
      ii. means for selectively generating a one bit selection signal and an (N−1)-bit non-selection signal from the N-bit vector, so that inversions in the selection signal appear at an output of the combinatorial logic circuit;
      iii. means for inverting the selection signal at least twice in succession; and
      iv. output means for supplying said selection signal and said non-selection signal as said N-bit test sequence.

6. The circuit of claim 5 wherein said inverting means comprises sequencing means for controlling a double inversion of each respective bit of a particular vector generated by said pseudo-random sequence generator.

7. The circuit of claim 5 or 6 further comprising:
   means for detecting a predetermined parity in said N-bit vector, said detecting means having an output at which a predetermined parity signal is supplied when the predetermined parity is detected; and
   a control circuit for gating said N-bit vector to said generating means under control of said predetermined parity signal, so that said N-bit vector is supplied to said generating means when said predetermined parity is detected and so that said N-bit vector is blocked from said generating means when said predetermined parity is not detected.

8. The circuit of claim 7 wherein said predetermined parity is an odd parity.

9. A method for testing a combinatorial logic circuit having N inputs, comprising the steps of:
   a. first generating a pseudo-random bit sequence in the form of an N-bit vector;
   b. second selectively generating selection and non-selection signals from said N-bit vector, said selection signal comprising one bit and said non-selection signal comprising (N−1) bits, said second generating being such that inversions in the selection signal appear at an output of the combinatorial logic circuit;
   c. inverting the selection signal at least twice in succession;
   d. supplying said twice inverted selection signal and said non-selection signals to respective ones of said N inputs, in parallel; and
   e. analyzing inversions in the selection signal at the output of the combinatorial logic to determine if there is a malfunction in the combinatorial logic.

10. The method of claim 9 comprising the further steps of:
    a. detecting whether said N-bit vector has a predetermined parity; and
    b. blocking said N-bit vector when said N-bit vector does not have said predetermined parity.

11. The method of claim 9 comprising the further step of selectively interconnecting the combinatorial logic circuit, to receive said twice inverted selection signal and said non-selection signals and to supply, for analyzing, the inversions in the selection signal at the output of the combinatorial circuit, only when the combinatorial logic is to be tested.

* * * * *